United States Patent [19]

Salzman

[11] Patent Number: 5,438,536
[45] Date of Patent: Aug. 1, 1995

[54] FLASH MEMORY MODULE

[75] Inventor: Scot W. Salzman, Vernon Hills, Ill.

[73] Assignee: U.S. Robotics, Inc., Skokie, Ill.

[21] Appl. No.: 223,103

[22] Filed: Apr. 5, 1994

[51] Int. Cl.⁶ ............................................. G11C 13/00
[52] U.S. Cl. ...................................... 365/52; 365/200
[58] Field of Search ...................... 365/52, 189.01, 200, 365/202, 244

[56] References Cited

U.S. PATENT DOCUMENTS

| | | | |
|---|---|---|---|
| 4,656,605 | 4/1987 | Clayton | 365/52 |
| 4,727,513 | 2/1988 | Clayton | 365/52 |
| 5,239,621 | 8/1993 | Brown, III et al. | 395/115 |
| 5,379,401 | 1/1995 | Robinson et al. | 365/52 |

OTHER PUBLICATIONS

Abstract of Articles: (1): "The Material Which Carries the Data (Memory Chips)", author unknown, *EEE Journal*, No. 6, pp. 52–55, West Germany; (2) New Flash SIMM Modules Offers Easier System Software Upgrades, author Anthony Strattner, *Computer Shopper Journal*, vol. 13, p. 85, (3): Single Inline Memory Modules, author unknown, *Computerworld*, p. 47.

Letter dated Dec. 29, 1993 from Langan to Salzman and enclosures: (1): a one-page undated brochure entitled "ROMDISK FE1-SIMM" (2) a one-page undated brochure entitled ROMDISK FE2-SIMM (3) a single drawing sheet entitled Flash TSOP SIMM Module and (4) a single drawing sheet entitled Flash TSOP Memory Array.

*Primary Examiner*—Terrell W. Fears
*Attorney, Agent, or Firm*—Banner & Allegretti, Ltd.

[57] ABSTRACT

A module incorporating flash memory chips. An interface enables power down of the chips in response to a power down signal and provides an interrupt signal indicating when all of the ready lines from the memory chips are in a ready state, thereby reducing the need for polling the status registers in the chips.

8 Claims, 2 Drawing Sheets 5,438,536

FLASH MEMORY MODULE

FIELD OF THE INVENTION

This invention relates to flash memories, and more particularly relates to a module for conveniently mounting and connecting a flash memory to digital circuitry.

DESCRIPTION OF THE PRIOR ART

Modules for mounting memory chips have been known in the past. Such modules are disclosed in U.S. Pat. No. 4,656,605 (Clayton, issued Apr. 7, 1987) and U.S. Pat. No. 4,727,513 (Clayton, issued Feb. 23, 1988).

The concept of including a flash memory in a module also is briefly discussed in U.S. Pat. No. 5,239,621 (Brown et al., issued Aug. 24, 1993) (column 3, lines 15-16).

Modules for mounting flash memories also have been sold by Curtis, Inc., St. Paul, Minn., under Model Nos. FE-1 and FE-2.

Although prior modules incorporating flash memory chips are useful for some applications, the applicant has found that they are deficient in several respects. For example, they do not provide for a power down mode which saves energy and allows a computer to protect some memory areas while other memory areas are being programmed. In addition, the known flash memory modules do not provide for an interrupt which indicates to the computer when a byte write or block erase has been completed within the flash chips.

SUMMARY OF THE INVENTION

In order to overcome the deficiencies of the prior art, a primary object of the present invention is to create a flash memory module in which a separate control signal can individually power down each flash chip memory in the module.

Yet another object of the invention is to provide a flash memory module which provides an interrupt line indicating to a computer when a byte write or block erase has been completed in the module.

A memory module made in accordance with a preferred mode of the invention basically comprises a plurality of flash memory chips, such as eight chips. Each of the chips has a status register and a ready line having a ready state indicating that the chip has completed a write or erase operation. Each chip also has a power down state initiated by a power down signal. A circuit board is used to mount each of the chips. An interface is also provided on the circuit board. The interface includes selection means for individually selecting each of the chips, as well as a power down bus for transmitting a separate power down signal to each of the chips. An interrupt means also is provided for indicating when all of the ready lines are in the ready state.

By using apparatus of the foregoing type, flash memories may be incorporated into digital circuitry with a degree of ease and convenience unattainable by prior modules. For example, due to the unique interrupt means, there is no need for individually polling each of the status registers by a computer associated with the module. In addition, the power down bus enables each of the chips to be individually powered down in order to save power consumption and also to protect some memory areas while other memory areas are being programmed.

BRIEF DESCRIPTION OF THE DRAWINGS

These and other objects, advantages and features of the invention will appear for purposes of illustration, but not of limitation, in connection with FIGS. 1-3, wherein like numbers refer to like parts throughout and in which.

DETAILED DESCRIPTION OF THE PRESENT INVENTION

Figure 1:
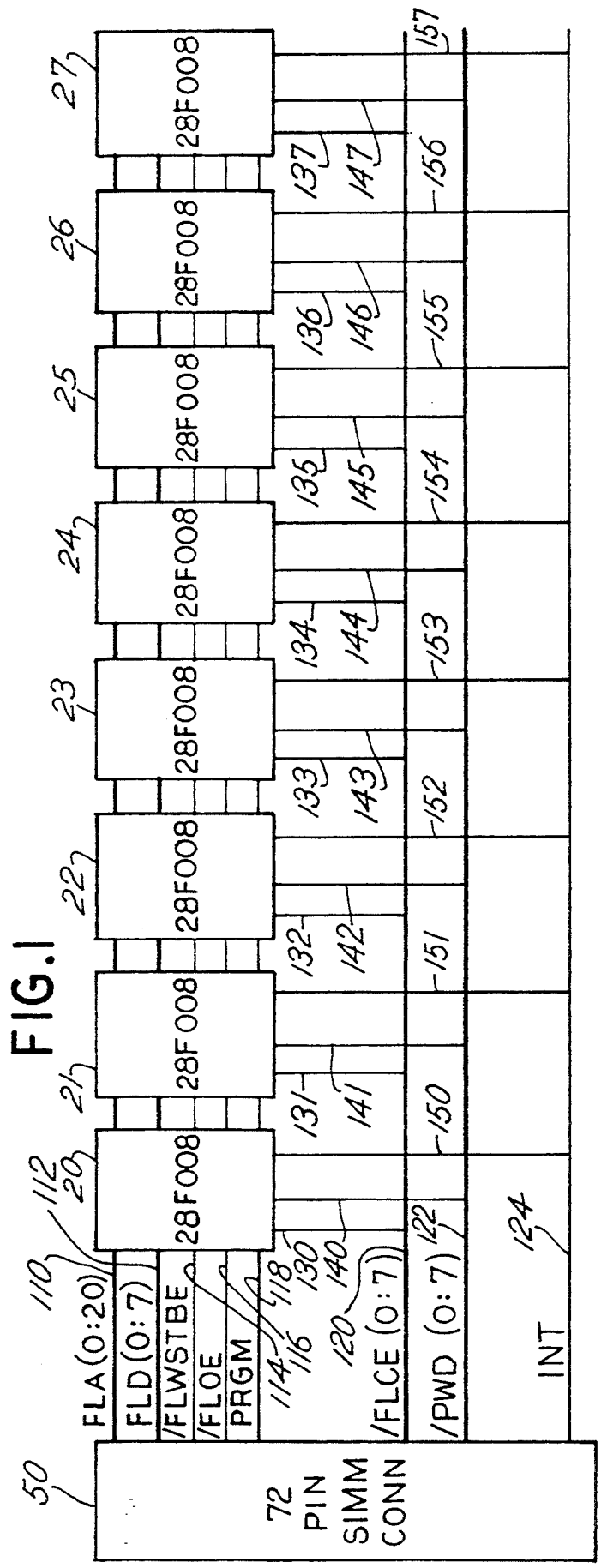
FIG. 1 is an electrical schematic block diagram of a preferred form of memory module made in accordance with the present invention.

Referring to FIG. 1, a preferred form of module made in accordance with the present invention comprises eight flash memory chips 20-27. Each of the chips can comprise Model 28F008SA manufactured by Intel Corporation. Each chip has sixteen 64K byte sectors which allow the module to be used as a solid state disk drive. The module allows a method of storing data in non-volatile memory.

Figure 2:
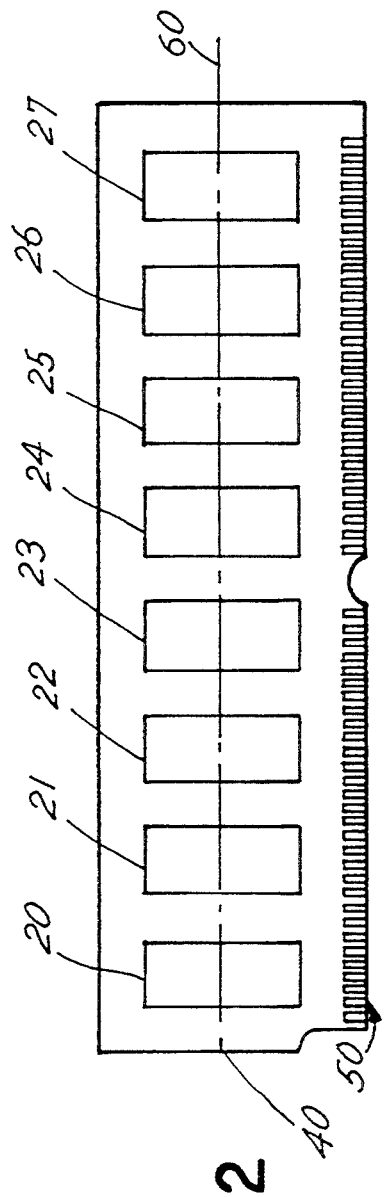
FIG. 2 is a front elevational view of a preferred form of memory module made in accordance with the present invention.

Referring to FIG. 2, chips 20-27 are mounted on a printed circuit board 40 allowing high integration in a small area. At the lower edge of the board are 72 pins 50 arranged as shown. The board uses TSOP type packages allowing a low profile arrangement. The module is socketable, allowing easy programmability and replacement. Chips 20-27 have their geometric center points located along a line 60. Board 40 preferably is about 4.26 inches long (parallel to the dimension of line 60). The height of the printed circuit board including the pins is about 1.36 inches. The thickness of board 40 is about 0.05 inches.

Referring to FIG. 1, the module is designed with an 8 bit interface 100 which includes a 21 bit address bus 110, an 8 bit data bus 112, a write strobe line 114, an output enable line 116, and a program voltage line 118. The interface also includes an 8 bit chip select bus 120 and an 8 bit power down bus 122, as well as an interrupt line 124. Each of the busses and lines is connected to the 72 pin connector assembly 50 in the manner shown.

Chips 20-27 are provided with select lines 130-137, power down lines 140-147 and ready/busy lines 150-157, respectively, all connected as shown. Lines 150-157 are wire ORed together by diodes 160-167 so that interrupt line 124 is raised to a logical 1 state if any of lines 150-157 indicate that a connected chip is busy, that is, there is a read operation or an erase operation taking place in the chip.

The definition of the pins within pin assembly 50 (FIG. 2) is shown in the following Table 1:

TABLE 1

| Signal Name | Pin Number | Active Level | Description |
| --- | --- | --- | --- |
| FLA | 11, 12, 13, 14, 15, 25, 26, 27, 28, 29, 56, 57, 58, 59, 60, 64, 65, 66, 67, 68, 69 | HIGH | Flash Address Bus 110. The signals on these pins are common to all chips and are used to address individual locations within each Flash chip. |
| FLD | 2, 4, 6, 8, 17, 19, 21, 23 | HIGH | Flash Data Bus 112. The signals on these pins are |

TABLE 1-continued

| Signal Name | Pin Number | Active Level | Description |
|---|---|---|---|
| | | | common to all chips and are used to transfer 8 bit data to or from each Flash chip and the interface of a connected CPU. |
| FLCE | 33, 45, 34, 46, 35, 47, 36, 48 | LOW | Flash Chip Select Bus 120. Each Flash chip has its own chip select line. These lines are decoded address lines from a CPU interface which enables one Flash chip at a time. |
| PWD | 40, 51, 41, 52, 42, 53, 43, 54 | LOW | Power Down Bus 122. Each Flash chip has its own Power Down signal. This signal is used to place a Flash chip in deep power down mode. In this mode, the Flash chip is protected from an inadvertent write while the programming voltage (PRGM) is at +12 V. |
| FLWSTBE | 39 | LOW | Flash Write Strobe Line 114. This line is common to all Flash chips. It is used to store data into a Flash chip during a write operation. |
| FLOE | 37 | LOW | Flash Output Enable Line 116. This line is common to all Flash chips. It is used to enable the output buffers on a Flash chip during read operations. |
| INT | 71 | HIGH | Interrupt Line 124. This line is common to all Flash chips. The signal on Line 124 is a diode ORed result of all Flash chip RDY/BSY lines. It is used to signal a CPU interface that an operation has completed within the Flash chip. This signal must be pulled up with a resistor, such as resistor 270 (FIG. 3). |
| PRGM | 50 | +12 V | Program Voltage Line 118. The power signal on Line 118 is common to all Flash chips. It is used to supply the programming voltage of (+12 VDC) when Flash chip erasing or programming is required. |
| VCC | 24, 30, 62 | +5 V | Power Supply Voltage +5 VDC. |
| GND | 1, 9, 16, 32, 38, 44, 49, 61, 70, 72 | 0 V | Power Supply Voltage 0 VDC (GND) |
| NC | 3, 5, 7, 10, 18, 20, 22, 31, 55, 63 | N/A | Should not be connected to any signal. Reserved for future enhancements. |

Figure 3:
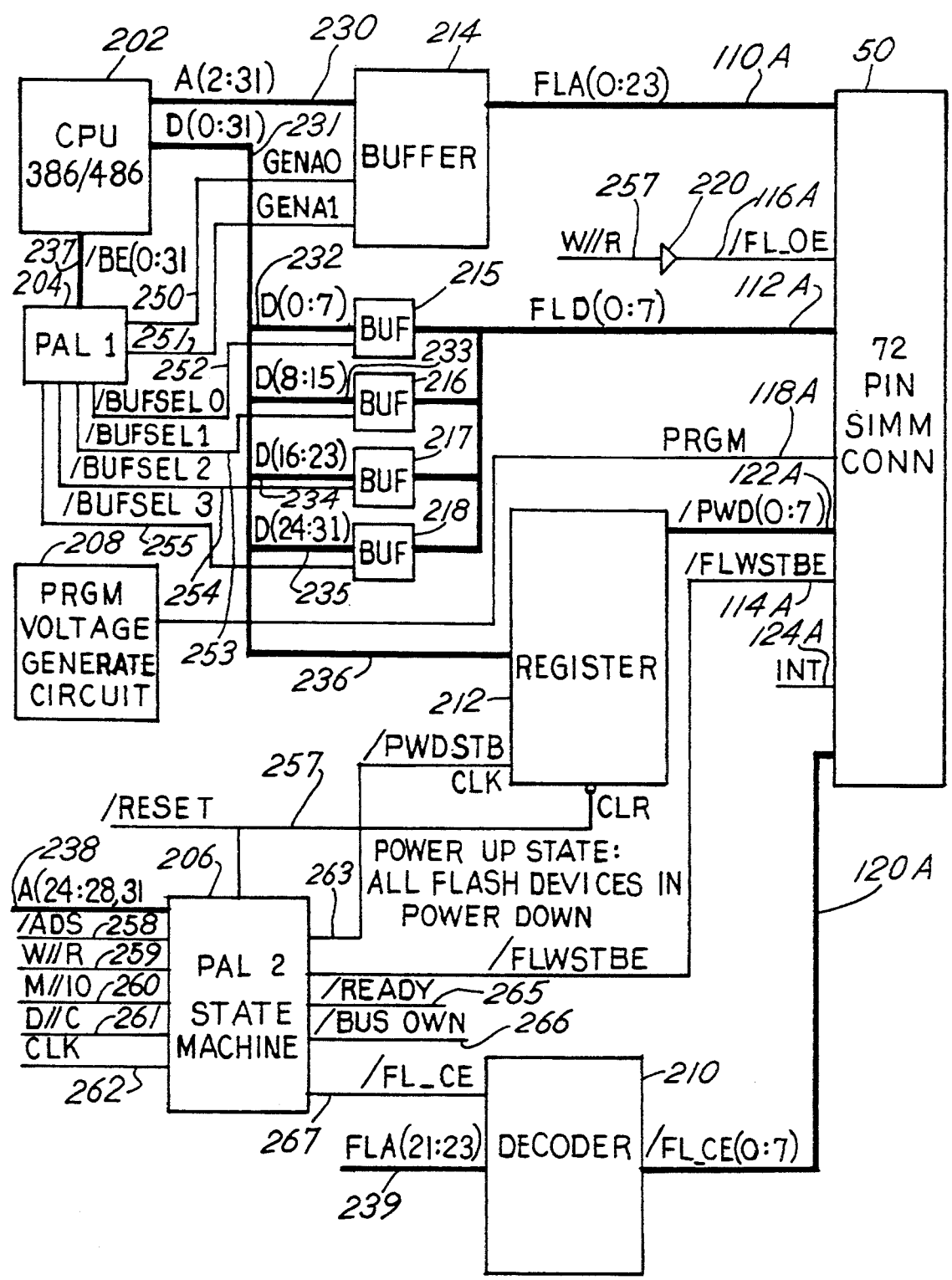
FIG. 3 is a electrical schematic block diagram of a preferred form of circuitry utilizing the memory module shown in FIGS. 1 and 2.

A preferred form of circuitry for utilizing the module described in FIGS. 1 and 2 is illustrated in FIG. 3. The circuit includes a central processing unit 202, a programmable array logic (PAL) 204, another programmable array logic (PAL) 206, a program voltage generate circuit 208, a decoder circuit 210, an 8 bit register 212 and buffer registers 214-218. The circuit also uses a driver amplifier 220.

The components of the circuit are interconnected by a 30 bit address bus 230 and a 32 bit data bus 231. Bits 0-7 of bus 231 are conducted into bus 232; bits 8-15 of bus 231 are conducted into bus 233; bits 16-23 of bus 231 are conducted into bus 234; and bits 24-31 of bus 231 are conducted into a bus 235. Bits 0-7 of bus 231 are conducted to a bus 236. Bits 24, 28 and 31 of address bus 230 are conducted to a bus 238. Bits 21 and 23 of an address bus 110A are used as inputs for decoder 210.

The circuit shown in FIG. 3 also is interconnected by various conductor lines. Lines 250 and 251 provide address signals. Lines 252-255 are used to select buffers 215-218, respectively. Line 257 dears register 212. Line 258 addresses PAL 206; line 259 provides a read/write signal to PAL 206; line 260 provides an IO signal to PAL 206; line 261 provides a data/control signal to PAL 206; and line 262 provides a clock signal to PAL 206. Line 263 provides a power strobe pulse to register 212; line 265 provides a ready signal to PAL 206 and line 266 provides a bus own signal to PAL 206 that enables read and write control of the module. Line 267 selects decoder 210.

The circuit in FIG. 3 results in busses and lines which are connected to the like numbered busses and lines shown in FIG. 1. The connection is made through the 72 pin array 50 shown at the right hand side of FIG. 3. For example, a 24 bit address bus 110A is connected through pin array 50 to the corresponding 21 bit address bus 110 shown in FIG. 1. Interrupt line 124A may be connected directly to the interrupt pin of CPU 202 or to an interrupt controller that is connected to CPU 202.

The illustrated module offers a number of advantages and features. Chips 20-27 can utilize series II flash devices from Intel that support 64K sectors, a power down feature, and a ready/busy signal. The module can support either one flash chip (e.g., chip 20) or up to a maximum of eight flash chips (i.e., chips 20-27) for a total of eight million bytes of memory. Interface 100 allows a separate control signal to individually power down each chip in the module through bus 122 and lines 150-157. This feature allows computer 202 (FIG. 3) to protect memory areas while other memory areas are being programmed. It also reduces power consumption in the power down mode. Interrupt line 124 is a diode-ORed result of all the ready/busy lines 150-157 from each of chips 20-27. Diodes 160-167 form a logical OR gate. The interrupt indicates to computer 202 when a byte write or block erase is completed within the chips. This feature eliminates the polling by CPU 202 of the status register within each of chips 20-27.

The module has a built-in expandability to future flash memories and will allow higher density to 16M×8 and beyond. Interface 100 provides individual chip selects through bus 120 and lines 130-137 to each of chips 20-27. Thus, no glue logic is needed on the module for accessing each of chips 20-27.

Those skilled in the art will recognize that the preferred embodiment described herein may be altered or modified without departing from the true spirit and scope of the invention as defined in the accompanying claims.

I claim:

1. A memory module comprising in combination:
   a circuit board having mounted thereon a plurality of flash memory chips, each said chip having a status register, a ready line having both a ready state, indicating that the chip has completed a write or erase operation, and a power down state initiated by a power down signal; and
   interrupt means for indicating when all of said ready lines are in said ready state, whereby the need for polling each of said status registers is reduced.

2. A module, as claimed in claim 1, and further comprising selection means for individually selecting each of said chips.

3. A module, as claimed in claim 2, and further comprising power down bus means for transmitting said power down signal to each of said chips.

4. A module, as claimed in claim 1, wherein said chips comprise eight chips.

5. A module, as claimed in claim 1, wherein said chips are arranged in a straight line.

6. A module, as claimed in claim 1, wherein said circuit board comprises pins arranged on only one side of said board.

7. A module, as claimed in claim 1, wherein said interrupt means comprises means for logically coupling said ready lines by a logical OR function.

8. A module, as claimed in claim 7, wherein means for logically coupling comprises diodes.

* * * * *